United States Patent [19]
Ziegler, Jr. et al.

[11] Patent Number: 5,126,681
[45] Date of Patent: Jun. 30, 1992

[54] IN-WIRE SELECTIVE ACTIVE CANCELLATION SYSTEM

[75] Inventors: Eldon W. Ziegler, Jr., Columbia; John W. Gardner, Silver Spring, both of Md.

[73] Assignee: Noise Cancellation Technologies, Inc., Linthicum, Md.

[21] Appl. No.: 421,759

[22] Filed: Oct. 16, 1989

[51] Int. Cl.⁵ .................. G06F 15/31; H04R 27/00
[52] U.S. Cl. ....................... 328/165; 328/167; 307/521; 307/529; 381/71; 381/94
[58] Field of Search ............... 307/529, 520, 521; 328/165, 167; 381/71, 94

[56] References Cited

U.S. PATENT DOCUMENTS 4,589,137  5/1986  Miller ........................... 381/94
4,658,426  4/1987  Chabries et al. ............... 381/94
4,672,674  6/1987  Clough et al. ................. 381/71

Primary Examiner—Timothy P. Callahan
Attorney, Agent, or Firm—James W. Hiney

[57] ABSTRACT

An in wire active cancelling system cancels undesirable repetitive signal components from a primary electronics signal controlling desired intelligent signal components and undesirable repetitive signal components. The primary electronic signal is fed as an input to an electronic mixer. A second input to the electronic mixer is a repetitive cancelling signal which is applied by the mixer to cancel the undesirable repetitive signal component from the primary signal without interfering with passage of the primary signal intelligent signal components. The repetitive cancellation signal is developed from a residual signal developed by the mixer and a timing signal obtained from a timing signal generator.

4 Claims, 4 Drawing Sheets

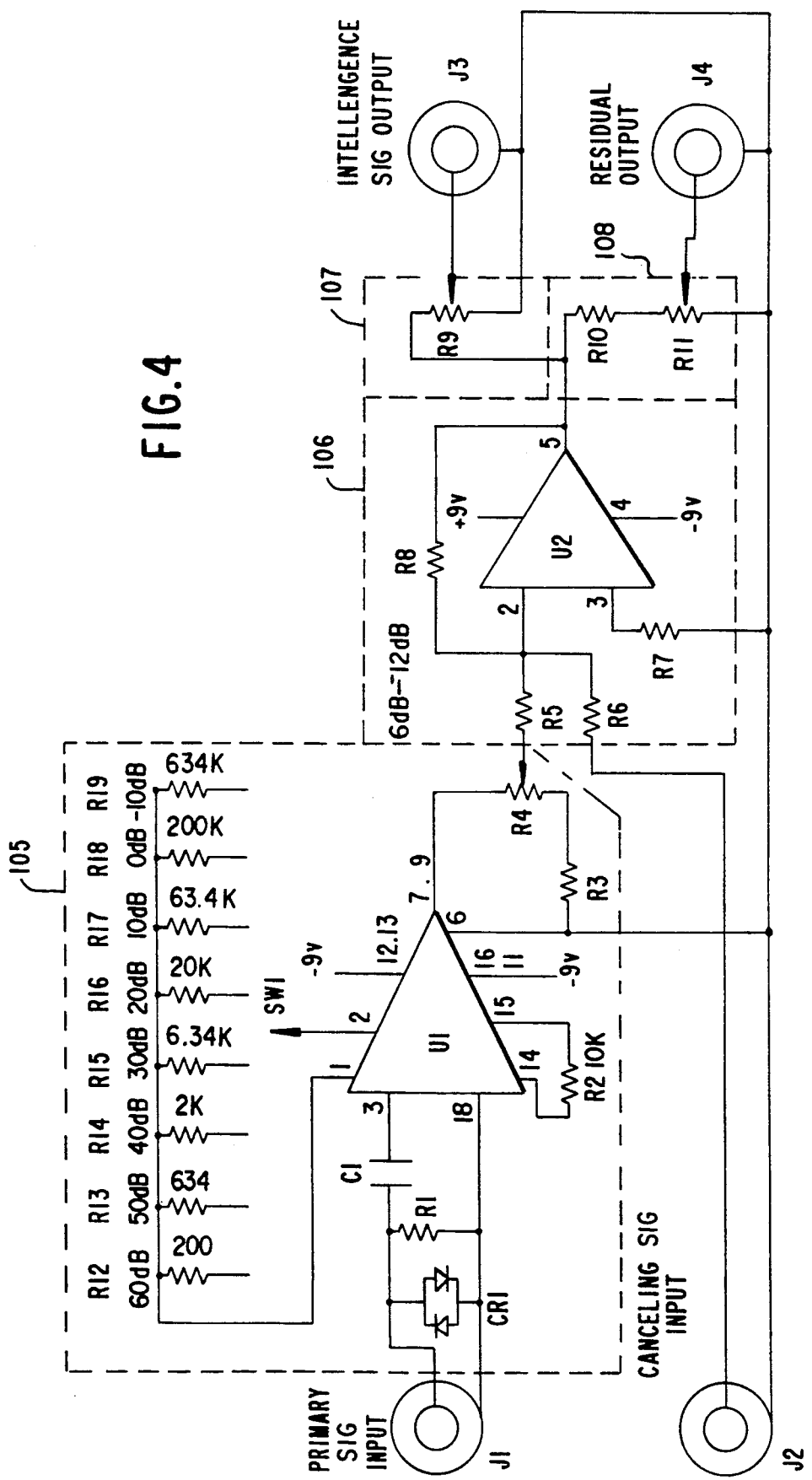

IN-WIRE SELECTIVE ACTIVE CANCELLATION SYSTEM

BACKGROUND AND SUMMARY OF THE INVENTION

The present invention relates generally to active cancellation systems for repetitive phenomena, and more specifically to a selective active cancellation system in which the cancellation takes place within an electronic circuit, i.e., in-wire.

Prior art analog notch filters are difficult to tune as the frequencies to be rejected change, require tight tolerances of components and often require non-standard values for components to select precisely the frequency to be rejected and have a small bandwidth.

Prior art active cancellation systems have required a sensor, such as a microphone, to detect the noise and an actuator, such as a speaker, to produce the cancelling antinoise. The present invention is directed toward eliminating the sensor and actuator for the cancellation of repetitive noise within communications, surveillance and related systems.

Linear flow, air duct systems, for example, Chaplin U.S. Pat. No. 4,122,303; Warnaka U.S. Pat. No. 4,473,906 and Eriksson U.S. Pat. Nos. 4,677,676 and 4,677,677, take advantage of directional flow in linear, one dimensional flow to utilize an upstream sensor, followed by a cancellation actuator and downstream error sensor in sequence. These systems cancel repetitive and random noise. Chaplin characterizes the control as a general convolution process, including a "programme of time-related operational steps." Warnaka uses adaptive filters to speed adaptation time and allow greater spacing between the speaker and the duct. Erikkson specifies recursive least means square (RLMS) and least means square (LMS) adaptive filters to perform the convolutions and measure the system transfer function sin the presence of noise.

These systems require both an upstream sensor and a downstream sensor and an actuator.

Systems for canceling repetitive noise and vibration, for example, Chaplin U.S. Pat. Nos. 4,153,815 and 4,417,098, describe the use of a synchronizing timing signal to provide selective cancellation of repetitive noise or vibration. Additionally a controller, actuator and error sensor are used. The method presented by Chaplin in these patents divides the noise or vibration period into a number of intervals and adjusts the amplitude of the canceling signal within each interval in response to the sign or amplitude of the error sensor within the same or a delayed interval.

In U.S. Pat. No. 4,490,841, Chaplin describes the use of Fourier transforms to process signals in the frequency domain. While this method might be used for random signals, processing time requirements generally limit its application to repetitive signals.

These systems require an error sensor and an actuator.

Cancellation of unwanted components within electronic signals generally is applied to communication signals. Renneck et al. in U.S. Pat. No. 4,232,381, use a commutation filter synchronized to the rotation of an engine to cancel self-generated engine noise within an electronic circuit. The level of the canceling signal is adjusted manually and no method is provided to adapt to phase shifts or varying amplitudes of different harmonics.

Garconnat et al. in U.S. Pat. No. 4,594,694 use two sensors, one sensing both the wanted and unwanted signals and the other sensing only the unwanted signals. Narrow band filters or Fourier transforms are used to eliminate the unwanted signals from the combined signal.

Widrow in "Adaptive Noise Canceling Principles and Applications", Proceedings of IEEE, Vol. 63, No. 12, December, 1975, describe two forms of active adaptive cancelers. The first, as illustrated in FIG. 1, uses a multi-tap adaptive FIR filter with a reference signal correlated with the noise to be cancelled. The reference signal is required to be within 90° in phase of the error signal. Consequently, the reference signal used by the adapter itself often requires filtering; the resulting approach is referred to as the "filtered-x algorithm."

The second form described by Widrow, as illustrated in FIG. 2, provides a single frequency notch filter and requires only two single tap filters. Again, a reference signal correlated with the noise is used and is phase shifted 90° for one of the filters. Glover, in "Adaptive Noise Canceling of Sinusoidal Interferences," Stanford University, Stanford, CA, May 1975, Ph.D. dissertation, extended this technique to multiple frequencies.

Each of Widrow's techniques requires a sensor for the reference signal, a sensor for the primary signal and a sensor for the error signal and requires that the cancellation take place numerically within the processor. Thus, the processor and associated elements must have sufficient bandwidth for all frequency components of the signal, not just those components to be cancelled.

Thus it is an object of the present invention to provide a selective active cancellation system for repetitive phenomean that eliminates sensors for the noise and the error and eliminates the actuator.

These and other objects are obtained by providing an electronic selective active cancellation controller and electronic mixer circuitry with inputs for the primary signal containing both noise and intelligence and for the cancellation signal from the controller and an output of the signal containing the intelligence with the repetitive noise cancelled.

In preferred embodiments, the cancellation controller contains all necessary filters, including antialiassing filters and reconstruction filters. Since the primary signal containing both the noise and intelligence is not passed through the cancellation controller, the intelligence signal component is not degraded by the controller filters and other circuitry. The primary signal is thus only affected by the repetitive noise cancelling signal fed to the electric mixer.

Other object, advantages and novel features of the present invention will become apparent from the following detailed description of the invention when considered in conjunction with the accompanying drawings.

BRIEF DESCRIPTION OF THE DRAWINGS

FIG. 4 is a schematic diagram of a circuit combining the level shifters and electron mixer of the FIG. 3 system, constructed to a preferred embodiment of the present invention.

DETAILED DESCRIPTION OF THE INVENTION

Figure 1:
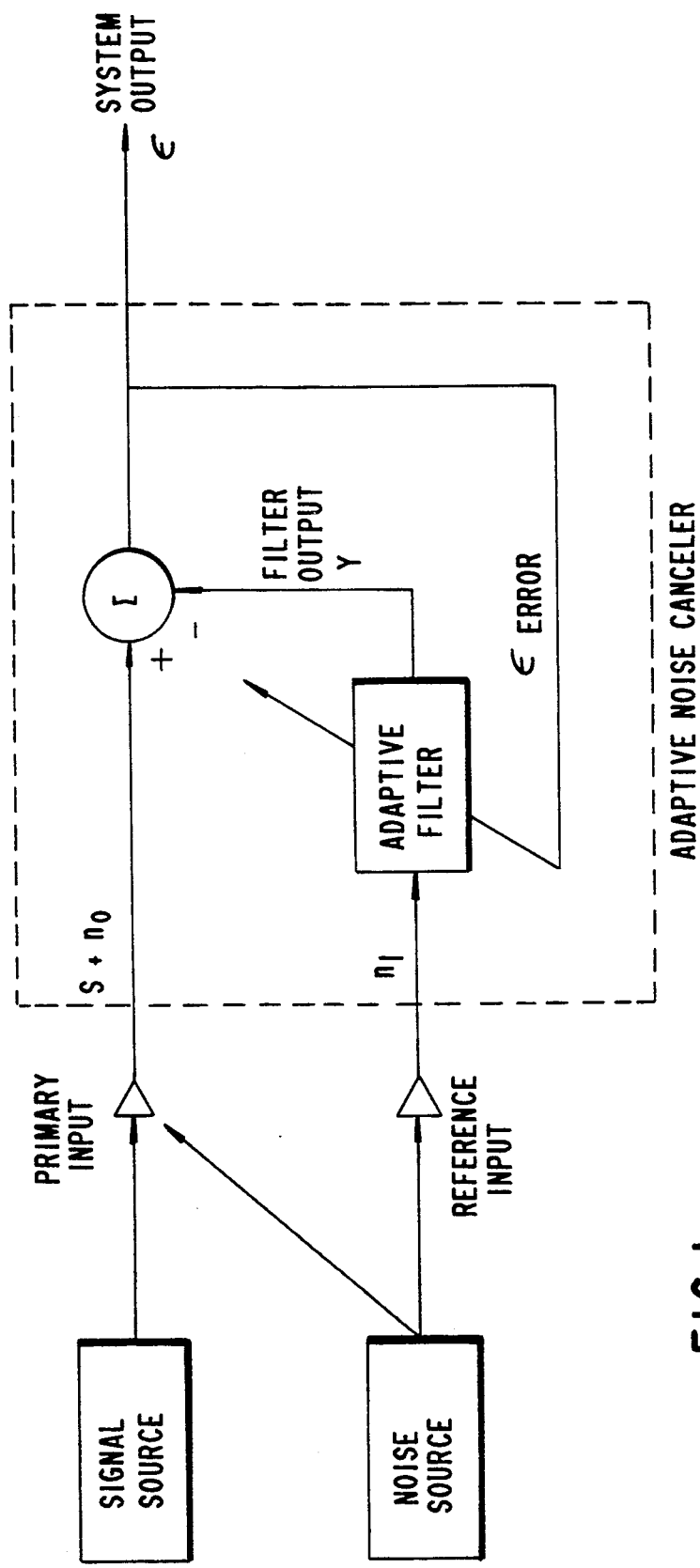
FIG. 1 schematically depicts a prior art adaptive noise cancellation system.
Figure 2:
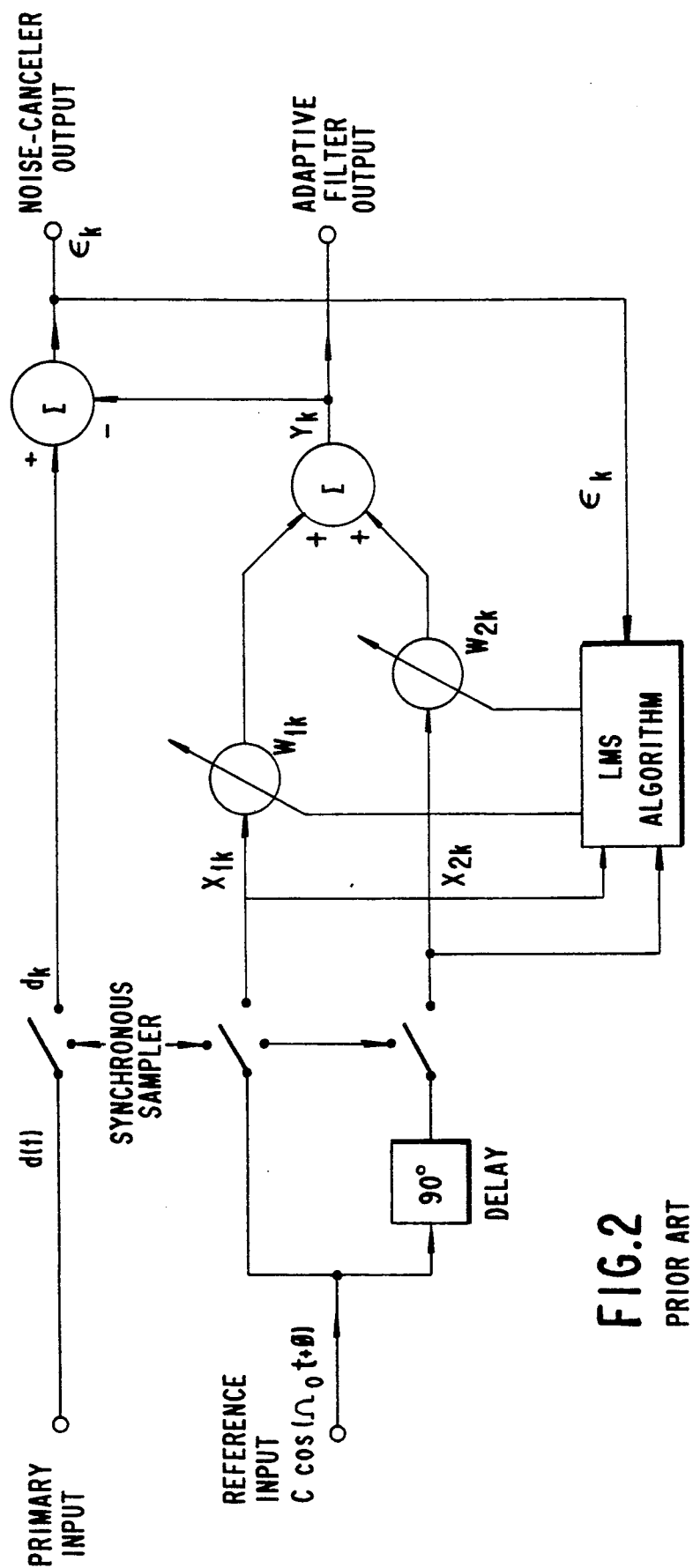
FIG. 2 is a schematic circuit diagram of a single frequency adaptive notch filter of the prior art FIG. 1 system.

FIG. 1 depicts a prior art approach to eliminating repetitive noise from electronic signals using analog notch or comb filters to remove all signals within bands around each frequency component to be eliminated. In FIG. 1, the signal from a signal source and an unwanted noise source is combined as a primary input to an analog filter circuit. The analog filter circuit includes an adaptive filter supplied with a reference input signal n from the noise source and an error signal error at the system output E. The output y from the filter is added (subtracted) at the adder or summer. FIG. 2 depicts the circuit, for the filter circuit outlined in dash lines in FIG. 1.

These above mentioned cancellation controllers produce the effects of notch widths down to a few Hertz. Furthermore, these controllers adjust the phase and amplitude of the cancelling signal to match only the frequency components of the primary signal that are correlated with the frequencies to be cancelled. Thus, the impact of the cancellation on the intelligence in the primary signal is minimized.

Figure 3:
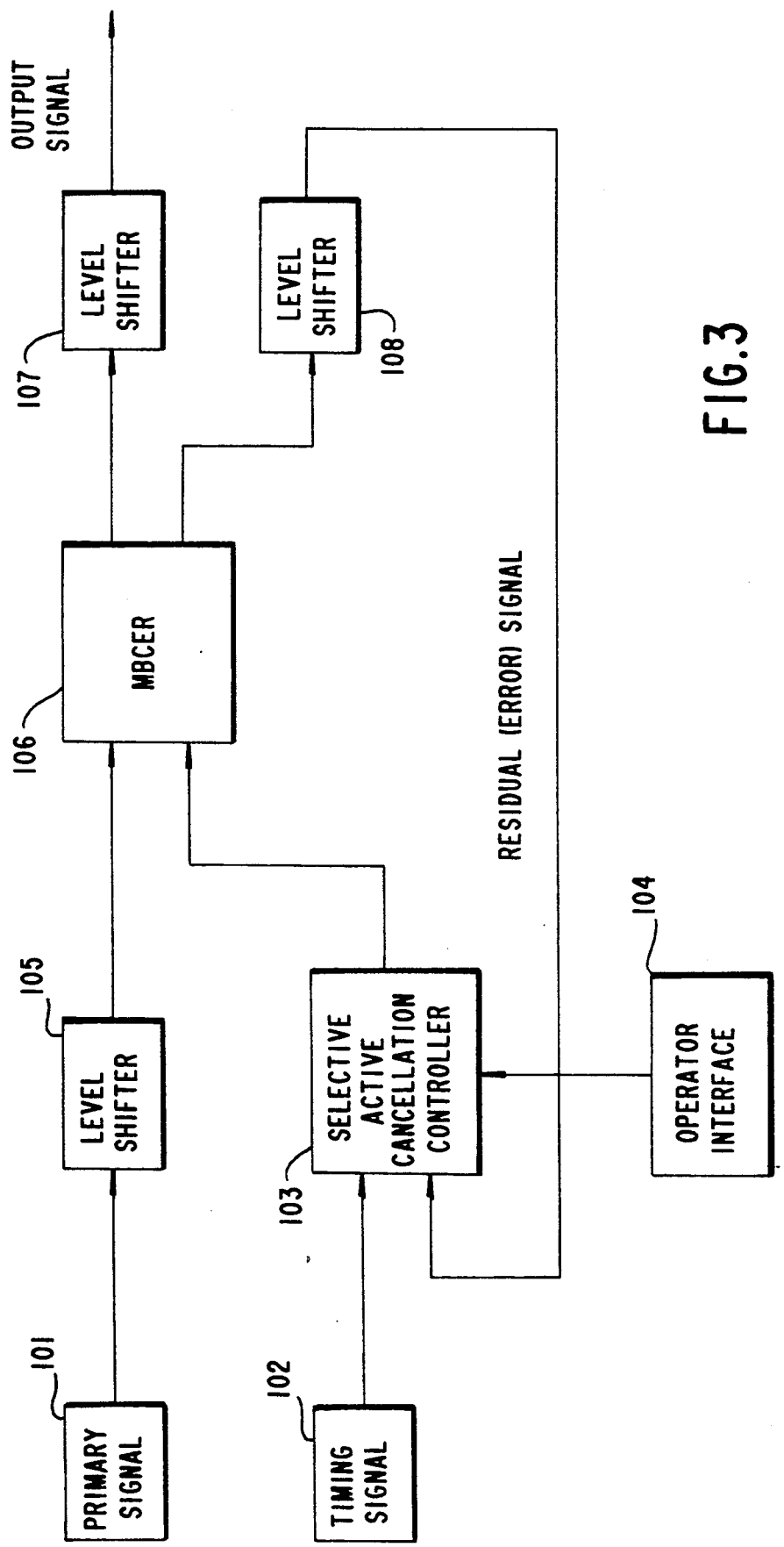
FIG. 3 is a block diagram of a selective active cancellation system constructed according to a preferred embodiment of the present invention.

FIGS. 3 and 4 depict preferred embodiments of the present invention. The timing signal 102 sets the fundamental frequency, $f_0$, to be cancelled by the selective active cancellation controller 103 and the optional operator interface 104 is used to select the range of frequencies within which the harmonics of $f_0$ will be cancelled.

The primary signal 101 containing both the undersired repetitive noise and the desired intelligence is shifted in level by level shifter 105 to match the level of the cancellation output of controller 103. The mixer 106 combines the primary signal and the cancellation signal to produce an output signal containing only the intelligence of the primary signal. The level shifter 107 sets the desired output level for the modified primary signal and the level shifter 108 matches the output level to the required level for the residual, error, input to the active cancellation controller 103.

FIG. 4 shows a circuit combining the functions of the level shifters and the mixer. Level shifter 105 is manually adjusted in this circuit and is composed of U1, CR1, C1, SW1, R1 thru R4 and R12 thru R19. CR1, R1 and C1 serve to protect U1 and AC couple the primary signal. SW1 selects one of R12 through R19 along with R2 to set the gain of U1 which is fine adjusted by R3 and R4. U1 is an instrumentation amplifier such as the AMP-01 by Precision Monolithics, Inc.

U2 and R5 thru R8 form the mixer 106 combining the level shifted primary signal and the cancellation output signal from the active cancellation controller 103. U2 is general purpose or other Op-Amp as required by the primary signal. Level shifter 107 is provided by R9 while R10 and R11 provide level shifter 108.

The active cancellation controller 103 contains all necessary filters, including anti-aliasing filters and reconstruction filters. Thus, the primary signal does not pass thru these filters and is unaffected except for cancellation of the repetitive noise.

Furthermore, the sampling rates, processing requirements and other requirements on the active cancellation controller are minimized since it only processes the frequency components of the signal within the range of frequencies to be cancelled. Thus, primary signals containing both low and high frequency components can have low frequency repetitive noise cancelled without affecting other low frequency components or high frequency components by a controller processing only the low frequencies which minimizes the bandwidth and cost of the controller.

Multiple harmonics and multiple fundamental frequencies (not natural harmonics of one another) can be cancelled in a simple manner by providing multiple synchronitation rates according to preferred embodiments of the invention. U.S. Pat. No. 4,878,188 issued Oct. 31, 1989 to Ziegler, Jr. and entitled "Selective Active Cancellation System For Repetitive Phenomena", hereby incorporated by reference in its entirety into the present specification, discloses such a method for determining and providing such cancellation signals.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Active cancellation system for cancelling undesirable repetitive signal components from a primary electronic signal containing desired intelligent signal components and undesirable repetitive signal components, comprising:

an electronic mixer producing a mixer output signal and a residual signal representation of the residual error in the mixer output signal, primary signal input means conducting the primary electronic signal as an input signal to the electronic mixer, a timing generator generating a timing signal related to the frequencies of the undesired repetitive signal components, selective active cancellation controller means receiving said timing signal from said timing signal generator and developing a repetitive cancellation signal for supply as a second input signal to the electronic mixer, and operator interface control means operatively connected to said selective active cancellation controller means for accommodating control of a range of frequencies within which the harmonics of desired fundamental frequency are to be cancelled, wherein said electronic mixer includes means for combining the primary electronic signal and the cancelling signal to produce the mixer output signal, the cancelling signal cancelling the undesirable repetitive signal components from the primary electronic signal while permitting passage of the desired intelligent signal components as the mixer output signal.

2. Active cancellation system for cancelling undesirable repetitive signal components from a primary electronic signal containing desired intelligent signal components and undesirable repetitive signal components, comprising:

an electronic mixer producing a mixer output signal and a residual signal representation of the residual error in the mixer output signal, primary signal input means conducting the primary electronic signal as an input signal to the electronic mixer, and a timing generator generating a timing signal related to the frequencies of the undesired repetitive signal components, selective active cancellation controller means receiving said timing signal from said timing signal generator and developing a repetitive cancellation signal for supplying a repetitive cancelling signal as a second input signal to the electronic mixer, and a primary signal input level shifter, operatively connected between said primary signal input means and said mixer, for shifting the level of said primary electronic signal so that the level of the undesirable repetitive signal components thereof match the level of the repetitive cancelling signal supplied to the electronic mixer, wherein said electronic mixer includes means for combining the primary electronic signal and the cancelling signal to produce the mixer output signal, the cancelling signal cancelling the undesirable repetitive signal components from the primary electronic signal while permitting passage of the desired intelligent signal components as the mixer output signal.

3. Active cancellation system for cancelling undesirable repetitive signal components from a primary electronic signal containing desired intelligent signal components and undesirable signal components, comprising:

an electronic mixer producing a mixer output signal and a residual signal representation of the residual error in the mixer output signal, primary signal input means conducting the primary electronic signal as an input signal to the electronic mixer, and a timing generator generating a timing signal related to the frequencies of the undesired repetitive signal components, selective active cancellation controller means receiving said timing signal from said timing signal generator and developing a repetitive cancellation signal for supplying a repetitive cancelling signal as a second input signal to the electronic mixer, and a primary signal output level shifter, operatively connected to said electronic mixer and receiving said mixer output signal, for shifting the level of the primary output wherein said electronic mixer includes means for combining the primary electronic signal and the cancelling signal to produce the mixer output signal, the cancelling signal cancelling the undesirable repetitive signal components from the primary electronic signal while permitting passage of the desired intelligent signal components as the mixer output signal.

4. Active cancellation system for cancelling undesirable repetitive signal components from a primary electronic signal containing desired intelligent signal components and undesirable repetitive signal components, comprising:

an electronic mixer producing a mixer output signal and a residual signal representation of the residual error in the mixer output signal, primary signal input means conducting the primary electronic signal as an input signal to the electronic mixer, a timing generator generating a timing signal related to the frequencies of the undesired repetitive signal components, selective active cancellation controller means receiving said timing signal from said timing signal generator and developing a repetitive cancellation signal for supply as a second input signal to the electronic mixer, and a residual error signal level shifter operatively connected between said mixer and said selective active cancellation controller for shifting the residual signal level to a required level for its input to the selective active cancellation controller, wherein said electronic mixer includes means for combining the primary electronic signal and the cancelling signal to produce the mixer output signal, the cancelling signal cancelling the undesirable repetitive signal components from the primary electronic signal while permitting passage of the desired intelligent signal components as the mixer output signal.

* * * * *